United States Patent
Kapusta (10) Patent No.: US 7,999,620 B2
(45) Date of Patent: Aug. 16, 2011

(54) AMPLIFIER WITH DITHER

(75) Inventor: Ronald A. Kapusta, Waltham, MA (US)

(73) Assignee: Analog Devices, Inc., Norwood, MA (US)

( * ) Notice: Subject to any disclaimer, the term of this patent is extended or adjusted under 35 U.S.C. 154(b) by 12 days.

(21) Appl. No.: 12/484,404

(22) Filed: Jun. 15, 2009

(65) Prior Publication Data

US 2010/0148878 A1  Jun. 17, 2010

Related U.S. Application Data

(60) Provisional application No. 61/122,078, filed on Dec. 12, 2008.

(51) Int. Cl.
*H03F 3/84* (2006.01)
(52) U.S. Cl. ........................................ 330/296; 348/308
(58) Field of Classification Search .......... 341/155–170; 330/296; 348/222.1, 308
See application file for complete search history.

(56) References Cited

U.S. PATENT DOCUMENTS

| | | | |
|---|---|---|---|
| 5,416,481 A * | 5/1995 | Chen | 341/131 |
| 5,606,291 A * | 2/1997 | Verbanets | 331/3 |
| 6,426,714 B1 * | 7/2002 | Ruha et al. | 341/143 |
| 6,473,019 B1 * | 10/2002 | Ruha et al. | 341/143 |
| 7,411,534 B1 | 8/2008 | Melanson | |
| 2010/0149360 A1 * | 6/2010 | Kapusta | 348/222.1 |

OTHER PUBLICATIONS

PCT International Search Report and Written Opinion for PCT/US2009/66701 mailed on Jan. 26, 2010.

* cited by examiner

*Primary Examiner* — Lam T Mai
(74) *Attorney, Agent, or Firm* — Kenyon & Kenyon LLP (57) ABSTRACT

An analog amplifier includes at least one signal path. Each of the at least one signal path extends between an input and an output and includes a load device coupled to the output and a transistor coupled to the input. The analog amplifier further includes a dither current source selectively coupled to one of the at least one signal path. The dither current source is capable of supplying dither current to the load device of the selected signal path directly by bypassing the transistor of the selected signal path.

18 Claims, 6 Drawing Sheets

AMPLIFIER WITH DITHER

FIELD OF THE INVENTION

The present invention is generally directed to analog amplifiers. In particular, the present invention is directed to analog amplifiers that add dither to output signals for improved analog to digital conversion. The amplifier may be used as a pre-amplifier of a comparator or an analog-to-digital converter.

BACKGROUND INFORMATION

Dither is intentionally added noise commonly used to mask non-linear behavior or non-ideal behavior in a circuit system. The process of generating dither noise is referred to as "dithering."

Quantization during analog to digital conversion may cause nonlinearities or non-idealities in output signals. In analog-to-digital converters (ADC), dithering may be used to de-correlate successive non-linear quantization errors. In other words, dither may be used to mask or smooth out nonlinearities such as abrupt or sharp changes in ADC transfer functions. The theory behind dithering is well known in the field of mixed signal processing.

Figure 1:
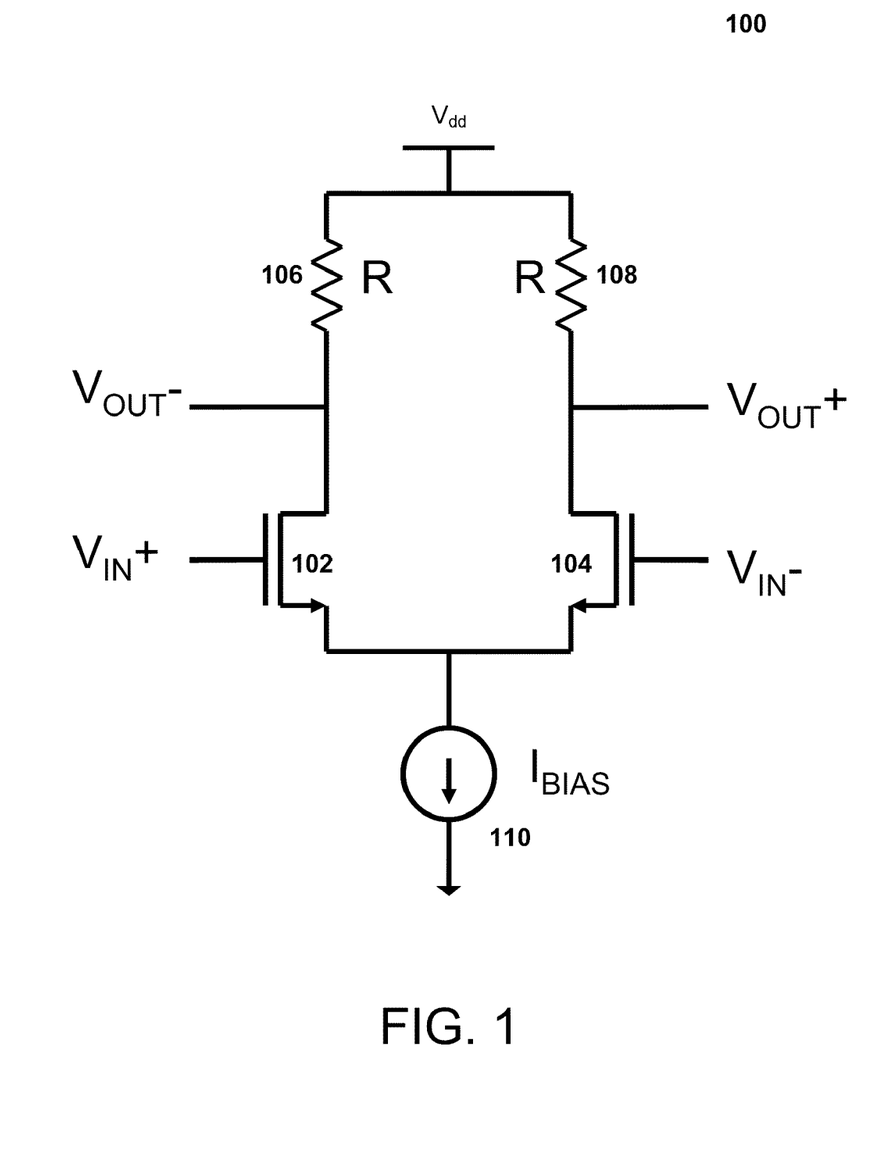
FIG. 1 is a conventional differential amplifier without dither.

FIG. 1 illustrates a conventional differential amplifier (100) commonly known in the art as the "long-tailed pair." This differential amplifier has a pair of transistors (102, 104) such as NMOS transistors commonly connected at the source ends, each of which may be coupled to a voltage reference $V_{DD}$ via a resistor load R (106, 108) at the drains of the transistors. The amplifier (100) may also include a common current source (110) that provides a bias current $I_{bias}$ through the transistors (102, 104). The bias current may set the operating point for the transistors. The amount of current passing through loads (106, 108) may be controlled by the respective input voltage signals $V_{in+}$ and $V_{in-}$ at the inputs of the transistors. Output voltages may be established at output terminals $V_{out+}$ and $V_{out-}$ based on the output currents.

It is commonly known that a differential amplifier amplifies the difference between the two input voltages ($V_{in+}-V_{in-}$) by a constant factor (called differential gain) to generate an output signal ($V_{out+}-V_{out-}$). Conventionally, the $I_{bias}$ in the long-tailed pair supplies approximately constant current to the amplifier (100) to set operating points of the transistors (102, 104). For such a conventional analog differential amplifier, the output difference ($V_{out+}-V_{out-}$) may be at a fixed ratio of the input voltage difference ($V_{in+}-V_{in-}$).

U.S. Pat. No. 6,172,629 to Fetterman (the '629 patent) describes methods and systems that use randomized voltage levels to dither a pipelined ADC. For example, FIG. 4 of the '629 patent shows a differential amplifier that includes a number of composite transistor pairs (T1A/T2A, T1B/T2B, T1C/T2C, and T1D/T2D). The opening and closing of T1B/T2B, T1C/T2C, and T1D/T2D are controlled by input voltage signals at gate pairs of M11/M21, M12/M22, and M13/M23, whose values may be determined by a random number generator. Through the randomized opening and closing of M11/M21, M12/M22, and M13/M23, the effective size of T1A/T2A pair may be changed randomly. Even though the effective size of T1A/T2A changes, the current source (110) was kept constant. To achieve the dithering objective, the '629 patent used multiple input transistors that may be switched on and off. However, when the input transistors are switched on and off, the inputs and outputs of the amplifier may be loaded with parasitics, which may cause undesirable effects. Additionally, for operations at low supply voltages, the configuration as shown in FIG. 4 of the '629 patent may have limited headroom. Under low supply voltages, the adequate voltage drop across the drain/source of a composite T may become an important design parameter to keep T in the saturation (i.e., high gain) region of operation. Voltage may drop across the inserted switch M between input transistor T and load resistor R and leave less voltage headroom for the input transistor T.

Therefore, there is a need for a dithering apparatus or method that has less parasitic effects and has greater headroom than previous attempts.

DETAILED DESCRIPTION

Embodiments of the present invention include an analog amplifier includes at least one signal path. Each of the at least one signal path extends between an input and an output and includes a load device coupled to the output and a transistor coupled to the input. The analog amplifier further includes a dither current source selectively coupled to one of the at least one signal path. The dither current source is capable of supplying dither current to the load device of the selected signal path directly by bypassing the transistor of the selected signal path.

Figure 2:
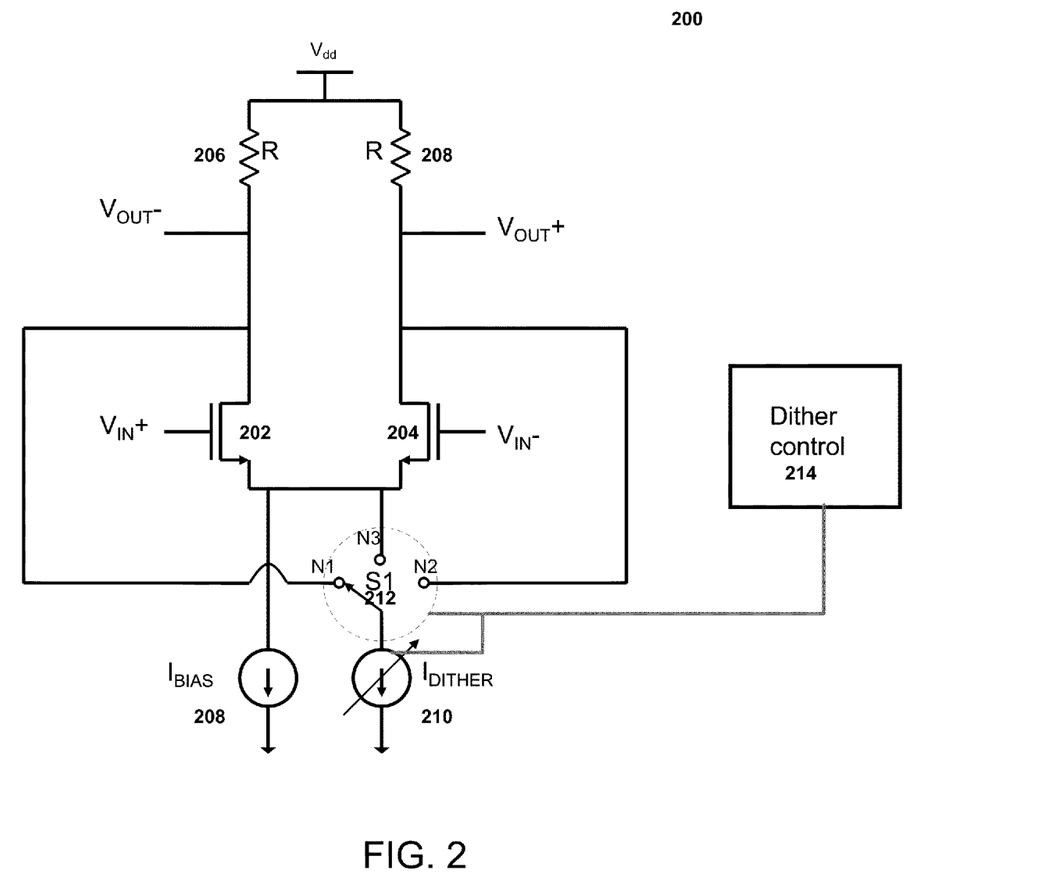
FIG. 2 shows a differential amplifier with an integrated dither source according to one embodiment of the present invention.

FIG. 2 shows a differential amplifier (200) with an integrated dither current source according to one embodiment of the present invention. FIG. 2 is for illustrative purpose. In different embodiments, the amplifier may include other configurations, for example, only one signal path extending between an input signal and an output signal (not shown). Referring to FIG. 2, the amplifier (200) may include a pair of signal paths (first signal path from $V_{in+}$ to $V_{out-}$, the second one from $V_{in-}$ to $V_{out+}$) that include transistors (202, 204), load devices (206, 208) coupled respectively to the transistors (202, 204). The amplifier (200) further may include a bias current source (208) and a dither current source (210). The dither current source may be selectively coupled to nodes N1, N2, N3 within the amplifier circuit via a three-throw switch S1. The bias current source 208 may be coupled to sources of the transistors at a common node N3.

The bias current source 208 may provide an approximately constant bias current $I_{bias}$ to the amplifier (200) as in conventional differential amplifiers. The dither current source 210 may supply a dither current to a connected mode N1, N2 or N3. When the dither current source is connected to node N1, a dither current may be directly supplied to the load of $V_{out-}$ which introduces a differential mode signal at the output. On the other hand, when the dither current source is connected to N2, a dither current may be directly supplied to the load of $V_{out+}$, which introduces a differential mode signal at the output in opposite orientation. When the dither current is connected to N3, the dither current is connected to the common node N3 along with the bias current $I_{bias}$, which introduces a common mode signal that could be rejected by subsequent signal processing. The dither current supplied by source 210 may be small as compared to the bias current supplied by source 208, for example $I_{dither}=0.1*I_{bias}$. However, under certain situations, $I_{dither}$ may be as large as $I_{bias}$.

During operation, the switch S1 may be connected to one of the three nodes (N1, N2, and N3) at a given time: to the $V_{out+}$ terminal (node N1), to the $V_{out-}$ terminal (node N2), or to a common node N3 coupling drains of the transistors (202, 204) to each other. For example, when S1 is switched to node N3 and the dither current $I_{dither}$ is connected to the common node, there is no differential offset to either side of the outputs. When S1 is switched to node N1, the dither current $I_{dither}$ is provided directly to load device 206 but not load device 208. The additional current may introduce a negative voltage offset at $V_{out-}$ in addition to the differential output signal ($V_{out+}-V_{out-}$) caused by the differential input signals ($V_{in+}-V_{in-}$) at transistors (202, 204). On the other hand, when S1 is switched to node N2, the dither current $I_{dither}$ is provided directly to load device 208 but not load device 206. The additional current induces a voltage offset at $V_{out+}$ in addition to the differential output signal ($V_{out+}-V_{out-}$) caused by the differential input signals ($V_{in+}-V_{in-}$) at transistors (202, 204). The positive and negative voltage offsets induced by switch S1 connecting to nodes N1 and N2 are opposite to each other. Accordingly, the dither circuit (210, 212) can induce offsets between the output terminals $V_{out+}$ and $V_{out}$ in a first or second direction, or can be set so as not to introduce any offset at all.

In an embodiment, the amplifier (200) may include a dither control device (214) to control switching of S1 randomly among the three nodes (N1, N2, N3) for each sampling period of an ADC. For example, at the beginning of each sampling period of an ADC, the dither control 214 may generate a random number and a control signal based on the random number. The control signal may cause S1 to be randomly connected to one of the three nodes (N1, N2, N3).

The magnitude of $I_{dither}$ as shown in FIG. 2 may also be variably controlled by the dither control (214). As such, the magnitude of the added dither may be controlled by changing the magnitude of $I_{dither}$. In this way, not only the offset may be added to either side of the differential amplifier, but also the magnitude of the offset may be varied under the control of the dither control device.

In an embodiment of the present invention, the magnitude of the dither in connection with the amplitude of $I_{dither}$ may be controlled adaptively according to operating conditions of an integrated circuit in which the amplifier is provided. For example, the magnitude of $I_{dither}$ may be controlled proportionally to the clock frequency of the device. Providing larger dither at higher clock frequencies can counteract effects of non-linear component behavior in electronic devices which can increase at high clock frequency. In another embodiment, the magnitude of dither may be proportional to variations of the clock frequency. For example, the magnitude of dither may be higher for larger variations of the clock frequency. In another embodiment, the dither magnitude may also be made responsive to operating temperature. For example, the amplitude of $I_{dither}$ may be controlled proportionally to the temperature or to a rate of temperature changes such as temperature changes over time. In yet another embodiment, the dither magnitude may also be made responsive to process variations such as variations of capacitance and resistance within an integrated circuit or across manufacturing lots of a common integrated circuit.

In an embodiment, $I_{dither}$ may be a part of $I_{bias}$ rather than a separate current source. Under this scenario, switches may be used to steer a portion of $I_{bias}$ (as $I_{dither}$) to either side of the differential amplifier to generate dither noise to the output. To disable dither, the part of $I_{bias}$ used for dithering the amplifier may simply be kept connected to the common source node.

Figure 3:
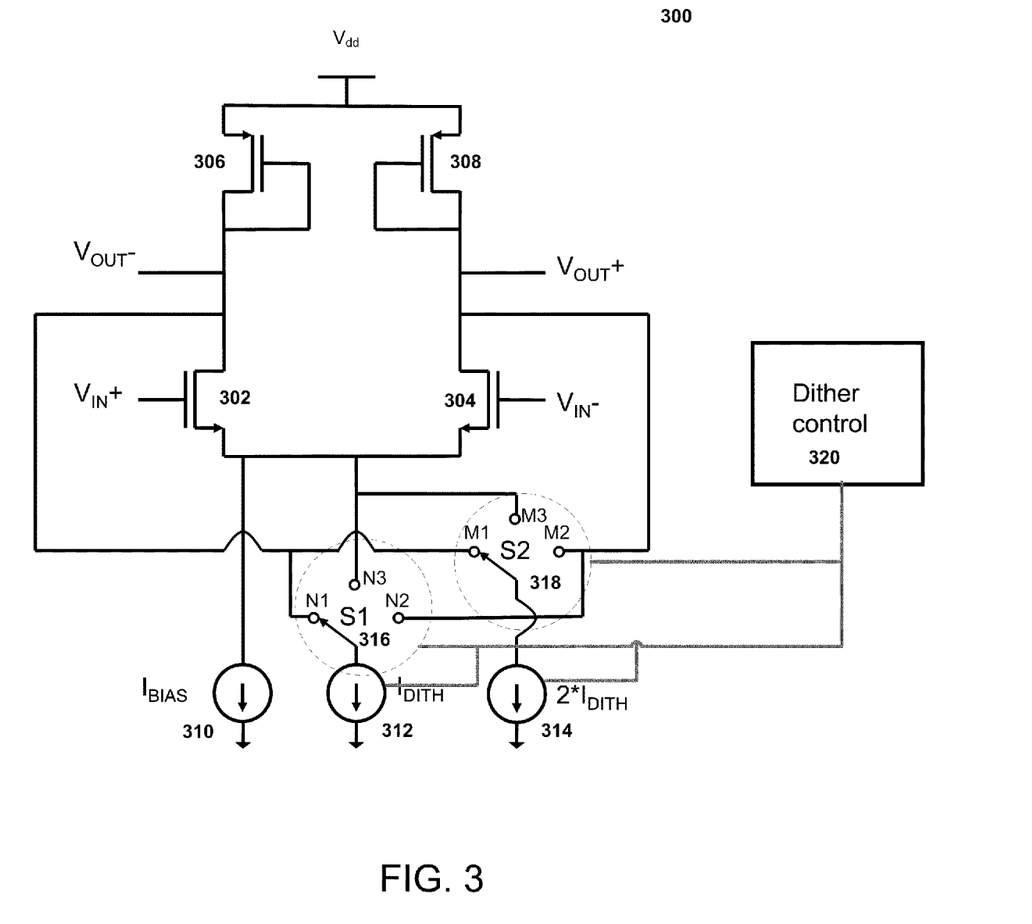
FIG. 3 shows a pre-amplifier with 2-bit dither according to one embodiment of the present invention.

According to another embodiment a differential amplifier may include a plurality of dither sources to generate multi-bit dithering. FIG. 3 shows an amplifier with 2-bit dither according to an embodiment of the present invention. The differential amplifier of FIG. 3 may include a pair of NMOS transistors (302, 304), diode loads (306, 308) coupled respectively to the transistors (302, 304), bias current source $I_{bias}$ (310) coupled to a common node connecting to the drains of the transistors (302, 304) and a plurality of dither current sources 310, 312. A first dither current $I_{dither}$ source (312) may be connected to one of the loads (306, 308) or the common node N3 via a first triple-throw switch S1 (316). A second dither current source may be selectively connected to one of the loads (306, 308) or the common node via a second triple-throw switch S2 (318) at nodes M1, M2, M3. In an embodiment, the dither sources 310, 312 may be scaled according to a binary weighting (e.g. $I_{dither}$, $2*I_{dither}$, etc).

During operation, the first switch S1 may be connected to one of three nodes of S1 (N1, N2, N3) at a given time: to the $V_{out+}$ terminal (node N1), to the $V_{out-}$ terminal (node N2), or to a common node N3 coupling drains of the transistors (302, 304). The switch S1 of FIG. 3 may provide negative or positive offset respectively to load devices 306 or 308 proportional to $I_{dither}$. Similarly, the second switch S2 may be connected to one of the three nodes of S2 (M1, M2, M3) at a given time to the $V_{out+}$ terminal (node M1), to the $V_{out-}$ terminal (node M2), or to a common node (M3) coupling drains of the transistors (302, 304). When S2 is switched to node M1, the dither current of $2*I_{dither}$ is provided directly to load device 306 but not load device 308. The additional dither current ($2*I_{dither}$) may introduce a negative voltage offset at $V_{out-}$ in addition to the differential output signal ($V_{out+}-V_{out-}$) caused by the differential input signals ($V_{in+}-V_{in-}$) at transistors (302, 304). The additional offset may be proportional to the magnitude of the dither current. On the other hand, when S2 is switched to node M2, the dither current $I_{dither}$ is provided directly to load device 308 but not load device 306. The additional current ($2*I_{dither}$) induces a voltage offset at $V_{out+}$ in addition to the differential output signal ($V_{out+}-V_{out-}$) caused by the differential input signals ($V_{in+}-V_{in-}$) at transistors (302, 304). The negative voltage offsets induced by switches S1 and S2 connecting to nodes N1 and M1 are opposite to the positive voltage offsets introduced by switches S1 and S2 connecting to nodes N2 and M2. Accordingly, the dither circuit (310, 312, 314, 316) can induce offsets between the output terminals $V_{out+}$ and $V_{out}$ in a first or second direction or can be set so as not to introduce any offset at all.

Table 1 is a truth table of the first and second dither current sources as applied to the negative load, the positive load, or the common node with respect to the node positions of S1 and S2. The negative and positive offsets may range from 0 to $3*I_{dither}$. Thus, Table I illustrates a 2 bit dither control.

TABLE 1

| S1 Position | S2 Position | Positive Offset | Negative Offset | No Offset |
| --- | --- | --- | --- | --- |
| N1 | M1 | 0 | 3 * $I_{dither}$ | 0 |
| N1 | M2 | 2 * $I_{dither}$ | $I_{dither}$ | 0 |
| N1 | M3 | 0 | $I_{dither}$ | 2 * $I_{dither}$ |
| N2 | M1 | $I_{dither}$ | 2 * $I_{dither}$ | 0 |
| N2 | M2 | 3 * $I_{dither}$ | 0 | 0 |
| N2 | M3 | $I_{dither}$ | 0 | 2 * $I_{dither}$ |
| N3 | M1 | 0 | 2 * $I_{dither}$ | $I_{dither}$ |
| N3 | M2 | 2 * $I_{dither}$ | 0 | $I_{dither}$ |
| N3 | M3 | 0 | 0 | 3 * $I_{dither}$ |

In an embodiment, the amplifier (300) may include a dither control device (320) to control the switching at S1 and S2 so that, at a given time, S1 may be randomly connected to one of N1, N2, N3 nodes, and S2 may be randomly connected to one of M1, M2, M3 nodes. In one embodiment, the random switching at S1 and S2 may occur for each sampling period of an ADC. The dither control device may include two independent random number generators for generating two independent control signals to S1 and S2. In one embodiment, the random numbers may be implemented using a linear feedback shift register (LFSR).

By randomly switching S1 and S2, total 2 bits of dither current may be generated for either side of the differential amplifier with offsets based on dither currents in Table 1. It should be noted that even though the circuit of FIG. 3 uses diode connected PMOS devices as loads, the effect of dither to the amplifier may be substantially similar to resistor loads or other types of load devices. Similar to the differential amplifier shown in FIG. 2, the magnitude of $I_{dither}$ may also be variable based on environmental factors such as the clock frequency, temperature and/or process variables.

The principles of the present invention may be extended beyond two bits. For example, 3 and 4 bits of a dither could be provided by adding additional dither current sources that extend the binary weighting (4*$I_{dither}$ and 8*$I_{dither}$ respectively). Thus, the principles present invention accommodates N bits of dither, where N can be tuned to suit individual needs. Two dither current sources may be sufficient for many uses.

The dither current $I_{dither}$ may also be added to other parts (other than the output) of the differential amplifier. For example, if the amplifier is includes a cascode device, the dither current may be added to the signal path not only at the output but also at other places such as the source node of the cascade device.

Figure 4:
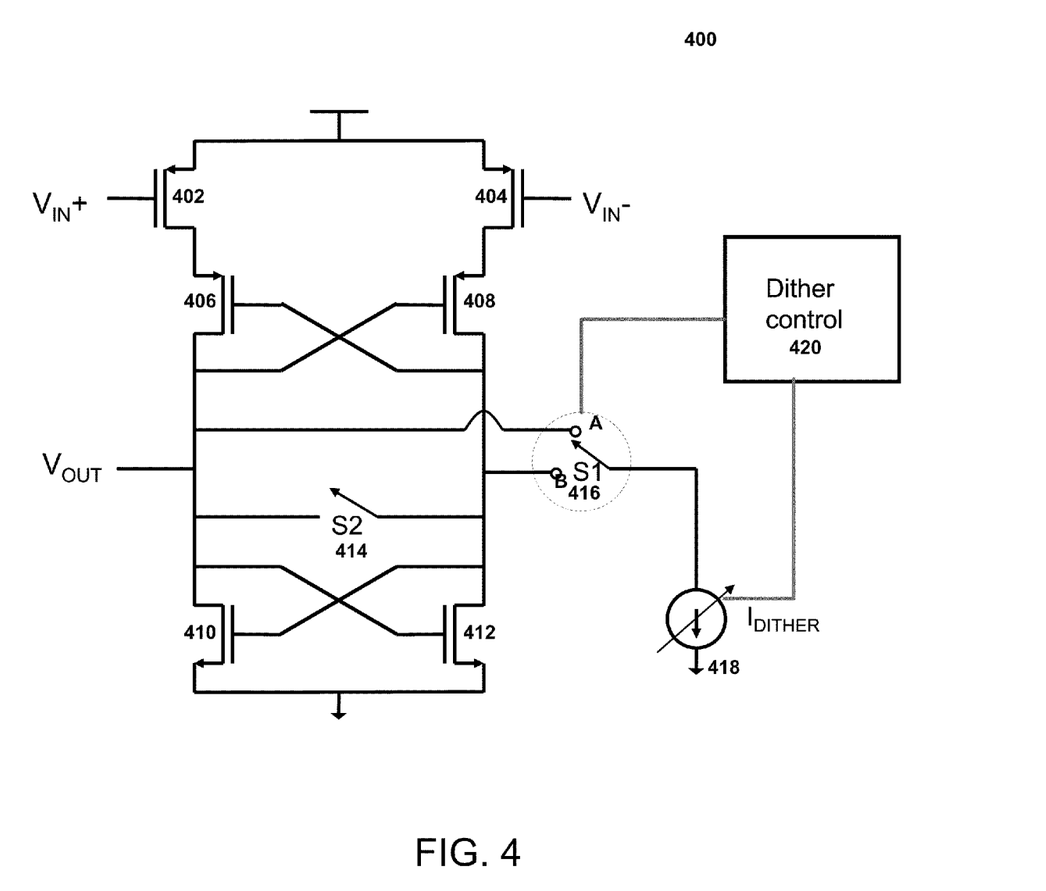
FIG. 4 shows a latch with dither according to one embodiment of the present invention.

Dither current source similar to the ones shown in FIGS. 2 and 3 may be added to other types of circuits such as a latch circuit in a comparator. FIG. 4 shows a two-stage latch circuit (400) with dither according to one embodiment. Referring to FIG. 4, the two-staged latch circuit may include a pair of input PMOS transistors (402, 404) commonly connected at their drains and two pairs of PMOS transistors (406, 408, 410, 412) constituting two stacked-up latches. The output of the input transistors is respectively coupled to one of the two inputs of the first PMOS latch pair whose outputs are coupled to the second latch pair. The latch circuit (400) may also include a switch S2 (414) for resetting states of the latch by short circuiting between the first and the second latch stages. In this embodiment, a dither current source $I_{dither}$ (418) may be selectively connected to one of the two outputs $V_{out}$ of the first stage latch via a double-throw switch S1 (416) to provide positive or negative offsets to $V_{out}$. The latches (400) may include a dither control device (420) that controls S1 so that the $I_{dither}$ may be randomly connected to either side of $V_{out}$.

S1 may be controlled by dither control (420). The dither control may generate a control signal based on a random number generator to be randomly connected to nodes A or B. In this way, random positive or negative offsets from $I_{dither}$ may be provided to the output $V_{out}$. Similar to the differential amplifier shown in FIG. 2, the magnitude of $I_{dither}$ may also be variable based on environmental factors such as the clock frequency, temperature and/or process variables.

Figure 5:
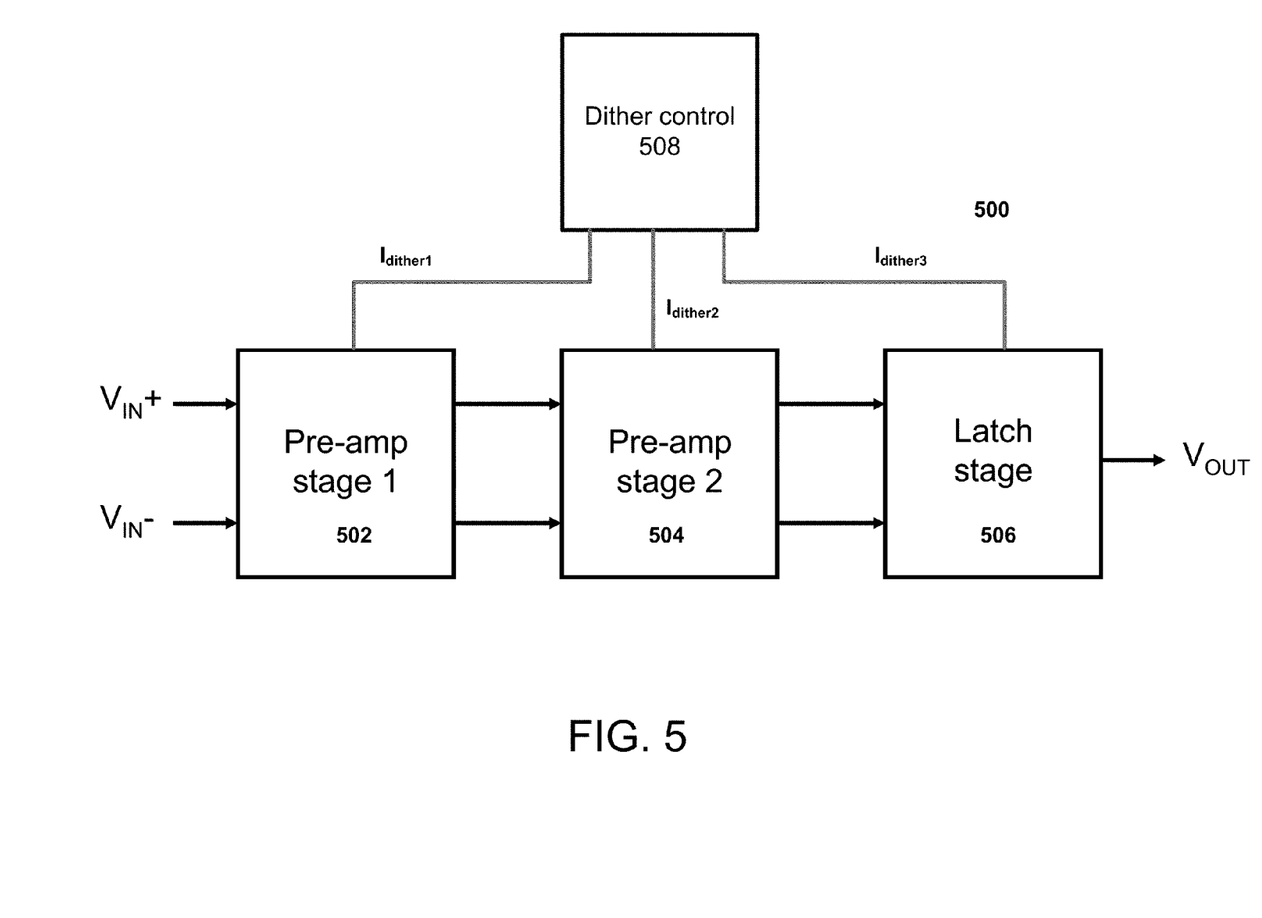
FIG. 5 shows a comparator structure with two pre-amp stages and a latch according to one embodiment of the present invention.

When a comparator has multiple stages of pre-amplifiers, dither currents may also be supplied at different stages. FIG. 5 shows a comparator structure with two pre-amp stages and a latch stage according to one embodiment of the present invention. The comparator may include a first stage pre-amp (502) coupled to a second stage pre-amp (504). The pre-amps may be differential amplifiers as shown in FIGS. 2 and 3, or other types of amplifiers. The two-stage pre-amps may be coupled to a latch stage (506) such as the one shown in FIG. 4.

To operate, dither currents may be supplied to each of the three stages to provide positive or negative offsets at the respective outputs at each stage. The dither control device (508) may control polarity and amount of offsets at each stage based on independent sequences of random numbers generated in the dither control device.

In one embodiment, the magnitudes of dither currents at different stages may be varied according to the stage. For example, assuming the dither currents for stages 1, 2, and 3 are $I_{dither1}$, $I_{dither2}$, and $I_{dither3}$, the dither currents may be set as $I_{dither1}=I_{dither2}/K1$ and $I_{dither2}=I_{dither3}/K2$, where K1 and K2 are scale factors. In one embodiment, K1 and K2 may be constant scale factors.

Figure 6:
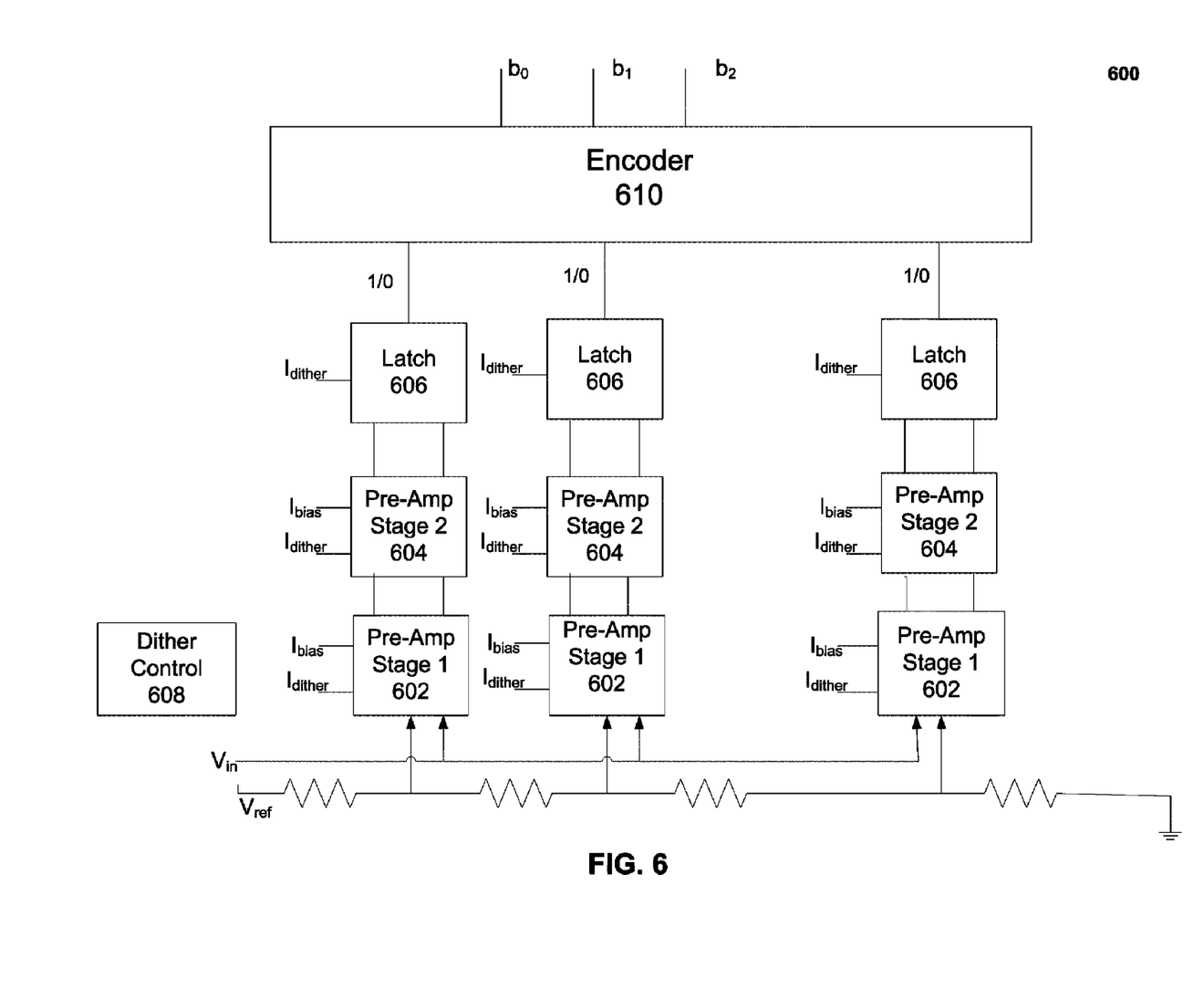
FIG. 6 shows an analog-to-digital converter with inputs from comparators with dither according to one embodiment of the present invention.

Embodiments of the present invention may also be used in devices including analog-to-digital converters (ADC). FIG. 6 shows an analog-to-digital converter with dither according to an embodiment of the present invention. Referring to FIG. 6, the ADC may include a series of comparators, each of which further includes a first stage pre-amp (602), a second stage pre-amp (604), and a latch circuit (606). As shown in FIG. 5, dither may be respectively supplied to the first stage pre-amp, the second stage pre-amp and the latch circuit. Each of the comparators is coupled to a different one input terminal of an encoder (610).

For this embodiment, an input voltage signal $V_{in}$ and a reference voltage $V_{ref}$ divided over an exemplary resistor ladder may provide first stage pre-amplifiers (602) with differential input signal pairs. The resistor ladder is for illustrative purpose. Other types of voltage divider may also be used to produce reference voltages. The input pairs ($V_{in}$ and $V_{ref}$) of signals may further undergo through a second stage of pre-amplifiers (604) whose output signals may be fed to latch circuits (606). Both the first and second stage of pre-amplifiers may be long-tailed differential amplifiers as shown in FIG. 2 each with a common source current of $I_{bias}$. Other types of pre-amplifier may also be used. Dither currents $I_{dither}$ may also be provided to each of the first and second stages of pre-amplifiers via triple-throw switches to provide positive and negative offsets as discussed in connection with FIG. 2. In one embodiment, the dither control device may control the switching of dither current in each pre-amplifier stage independently. Therefore, the triple-throw switch for the first stage of the pre-amplifier is operated independent of the triple-throw switch for the second stage of the pre-amplifier.

The output signals of the second stage of pre-amplifiers may be provided to a latch for comparing signals representing $V_{in}$ and $V_{ref}$. The latch may also be supplied with dither currents controlled by the dither control device (see FIG. 4). The output of the latch may be a binary digit (1/0) indicating whether $V_{in}$ is greater than $V_{ref}$ after divided by a voltage divider. An encoder (610) may be used to encode the digital output in binary—thus converting analog $V_{in}$ to binary codes. For example, an eight levels of quantization of input signals may be encoded into three bits of binary digits (b0-b2).

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

What is claimed is:

1. An analog amplifier, comprising:
   at least one signal path, each extending between an input and an output, and each including a load device coupled to the output and a transistor coupled to the input; and
   a dither current source selectively coupled to one of the at least one signal path, the dither current source supplying dither current to the load device of the selected signal path directly by bypassing the transistor in the selected signal path.

2. The analog amplifier of claim 1, wherein a source of the transistor in each of the at least one signal path is coupled to the load device in the each path.

3. The analog amplifier of claim 1, further comprising a bias current source coupled to drains of the transistors in the at least one signal path.

4. The amplifier of claim 3, wherein a magnitude of the dither current varies based on a clock frequency of an integrated circuit in which the amplifier is provided.

5. The amplifier of claim 3, wherein a magnitude of the dither current varies based on a temperature measurement of an integrated circuit in which the amplifier is provided.

6. The amplifier of claim 3, wherein the amplifier has only one signal path, and wherein the dither current is selectively coupled to one of the load device in the signal path and the bias current source.

7. The amplifier of claim 3, wherein the amplifier includes a pair of signal paths that constitute a differential amplifier, the input of which is the a difference of input voltage potentials at the transistors in the pair of signal paths, and the output of which is a difference of voltage potentials of the load devices in the pair of signal paths.

8. The analog amplifier of claim 7, further comprising:
   a switch for selectively connecting the dither current source to the signal paths, the switch including three nodes, the first node capable of connecting the dither current source directly to the load in a first signal path, the second node capable of connecting the dither current source directly to the load in a second signal path, and the third node capable of connecting the dither current source to the bias current source; and
   a control device coupled to the switch, the control device capable of generating a control signal that triggers the switch to be connected at one of the three nodes at a given time.

9. An analog amplifier, comprising:
   at least one signal path, each extending between an input and an output, and each including a load device coupled to the output and a transistor coupled to the input;
   a dither current source selectively coupled to one of the at least one signal path, the dither current source supplying dither current to the load device of the selected signal path directly by bypassing the transistor in the selected signal path,
   a bias current source coupled to drains of the transistors in the at least one signal path,
   a switch for selectively connecting the dither current source to the signal paths, the switch including three nodes, the first node capable of connecting the dither current source directly to the load in a first signal path, the second node capable of connecting the dither current source directly to the load in a second signal path, and the third node capable of connecting the dither current source to the bias current source; and
   a control device coupled to the switch, the control device capable of generating a control signal that triggers the switch to be connected at one of the three nodes at a given time,
   wherein the amplifier includes a pair of signal paths that constitute a differential amplifier, the input of which is the a difference of input voltage potentials at the transistors in the pair of signal paths, and the output of which is a difference of voltage potentials of the load devices in the pair of signal paths, and
   the control signal is generated based on a random number generator so that the switch is randomly connected at one of the three nodes.

10. The analog amplifier of claim 8, wherein the control signal is generated according to sampling times of an analog-to-digital converter.

11. The amplifier of claim 1, wherein the dither current source comprises a plurality of current sources having unequal magnitudes, each of the current sources selectively and independently connect to the at least one path.

12. The amplifier of claim 1, wherein dither current sources are selectively connected to more than one signal paths.

13. A comparator, comprising:
    at least one pre-amplifier, the at least one pre-amplifier including:
       at least one signal path, each extending between an input and an output, and each including a load device coupled to the output of the at least one pre-amplifier and a transistor coupled to the input of the at least one pre-amplifier; and
       a first dither current source selectively coupled to one of the at least one signal path, the first dither current source supplying dither current to the loading device of the selected signal path directly by bypassing the transistor of the selected signal path; and
    a latch circuit coupled to the at least one pre-amplifier, the latch circuit having a first and second outputs, the latch including a second dither current source selectively coupled to one of the first and second outputs of the latch circuit.

14. The comparator of claim 13, wherein the pre-amplifier includes a pair of signal paths that constitute a differential amplifier, the input of which is the a difference of input voltage potentials at the transistors in the pair of signal paths, and the output of which is a difference of voltage potentials of the load devices in the pair of signal paths.

15. The comparator of claim 14, further comprising:
    a first switch for selectively connecting the first dither current source to the signal paths, the first switch including three nodes, the first node capable of connecting the first dither current source directly to the load in a first signal path, the second node capable of connecting the first dither current source directly to the load in a second signal path, and the third node capable of connecting the first dither current source to a bias current source;

a second switch having two nodes for selectively connecting the second dither current source to one of the two outputs of the latch circuit; and a control device coupled to the first and second switches, the control device capable of generating a first control signal that triggers the first switch to be connected at one of the three nodes at a given time and generating a second control signal that triggers the second switch to be connected at one of the two nodes.

16. An analog-to-digital converter (ADC), comprising:

a plurality of comparators, each including:

at least one pre-amplifier, the at least one pre-amplifier including:

at least one signal path, each extending between an input and an output, and each including a load device coupled to the output of the at least one pre-amplifier and a transistor coupled to the input of the at least one pre-amplifier; and a first dither current source selectively coupled to one of the at least one signal path, the first dither current source supplying dither current to the loading device of the selected signal path directly by bypassing the transistor of the selected signal path; and a latch circuit coupled to the at least one pre-amplifier, the latch circuit having a first and second outputs, the latch including a second dither current source selectively coupled to one of the first and second outputs of the latch circuit.

17. An analog amplifier, comprising:

two symmetrical signal paths, each including a load component and a signal amplification component, the load component coupled to one of a pair of differential outputs, the signal amplification component coupled to one of a pair of differential inputs; and dither current source selectively coupled to each of the signal paths, the dither current source supplying dither current to the load component of the selected signal path directly by bypassing the amplification component of the selected signal path.

18. An amplifier, comprising:

a pair of load devices each coupled to a common source potential;

a pair of input transistors, each coupled to a respective load device and providing a signal path, each input transistor coupled to one of a pair of differential inputs;

a bias current source coupled to the drains of the input transistors; and a dither current source selectively coupled to sources of the input transistors and to the drains of the input transistors.

* * * * *